United States Patent [19]
Chen et al.

[11] Patent Number: 6,011,443
[45] Date of Patent: Jan. 4, 2000

[54] CMOS VOLTAGE CONTROLLED OSCILLATOR

[75] Inventors: Jason Chen, San Jose; Ping Xu, Milpitas, both of Calif.

[73] Assignee: Seiko Epson Corporation, Tokyo, Japan

[21] Appl. No.: 09/116,646

[22] Filed: Jul. 16, 1998

[51] Int. Cl.[7] .................................................. H03B 5/24
[52] U.S. Cl. .................... 331/57; 331/175; 331/177 R; 331/185
[58] Field of Search .................. 331/34, 57, 175, 331/177 R, 185, 186

[56] References Cited

U.S. PATENT DOCUMENTS

| | | | |
|---|---|---|---|
| 4,947,140 | 8/1990 | Tateishi | 331/113 R |
| 5,061,907 | 10/1991 | Rasmussen | 331/57 |
| 5,216,390 | 6/1993 | Erftemeijer et al. | 331/113 R |
| 5,239,274 | 8/1993 | Chi | 331/57 |
| 5,399,995 | 3/1995 | Kardontchick et al. | 331/17 |
| 5,469,120 | 11/1995 | Nguyen et al. | 331/177 R |
| 5,635,880 | 6/1997 | Brown | 331/108 B |
| 5,644,270 | 7/1997 | Moyer et al. | 331/34 |
| 5,673,008 | 9/1997 | Sumita | 331/57 |
| 5,703,543 | 12/1997 | Taylor | 331/116 FE |
| 5,815,042 | 9/1998 | Chow et al. | 331/57 |

*Primary Examiner*—David Mis

[57] ABSTRACT

A CMOS voltage controlled oscillator (VCO) having an improved voltage-to-current converter and an active MOS load operating in the triode region to provide improved performance characteristics including a small differential logic swing and a high frequency output. The voltage-to-current converter of the CMOS VCO comprises a pair of MOS transistors, one of which has an aspect ratio ($W_P/L_P$) and the other of which has an aspect ratio ($W_P/L_P$)/n, wherein 1<n<4. This configuration causes a third MOS transistor in the voltage-to-current converter to operate exclusively in the triode region. The CMOS VCO also includes an ICO portion having a plurality of delay stages connected in a ring configuration. Each of the delay stages comprises a pair of input MOS transistors and a pair of load MOS transistors. In accordance with the invention, the voltage-to-current converter causes each of the load MOS transistors to operate in the triode region.

7 Claims, 4 Drawing Sheets

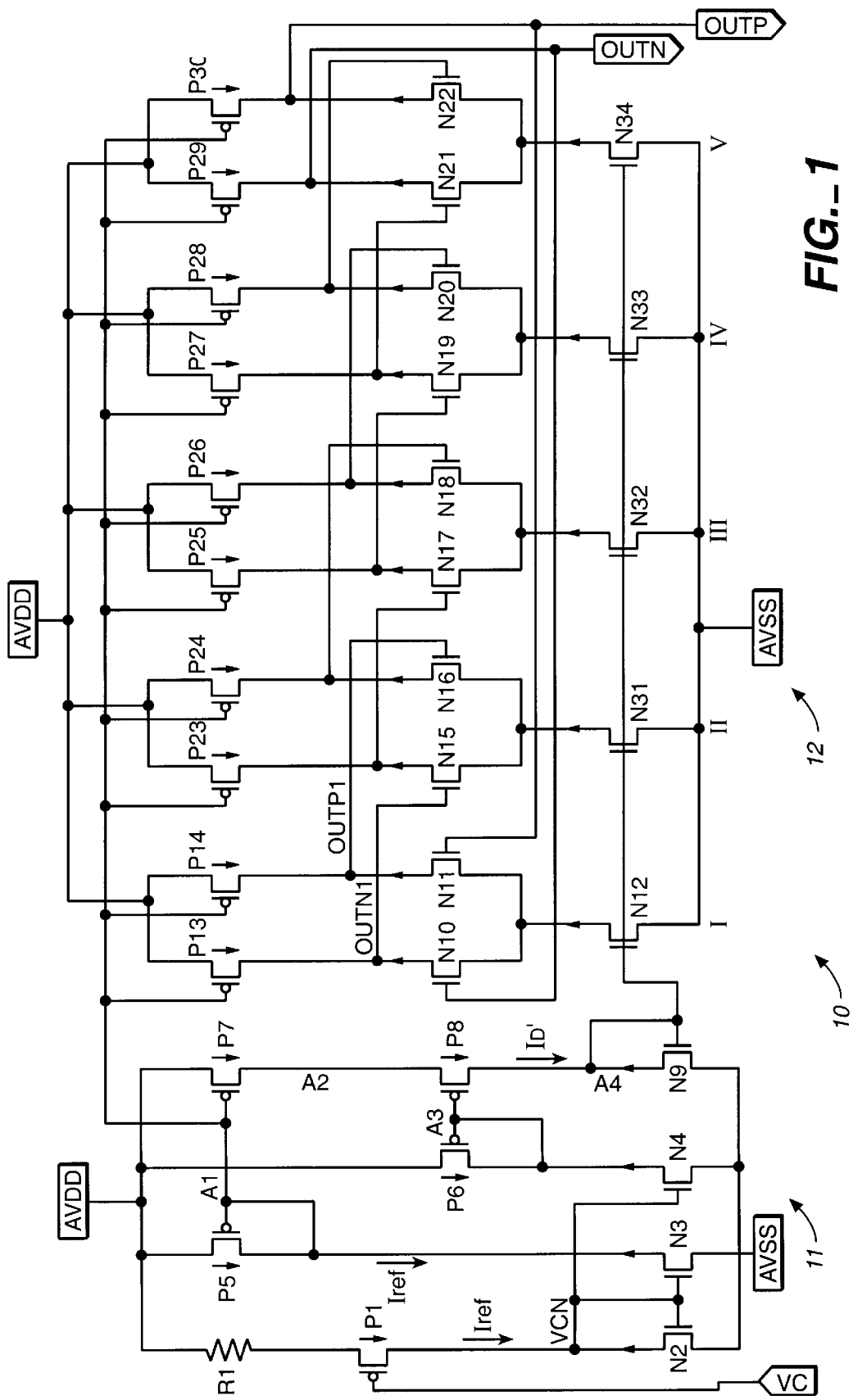
FIG._1

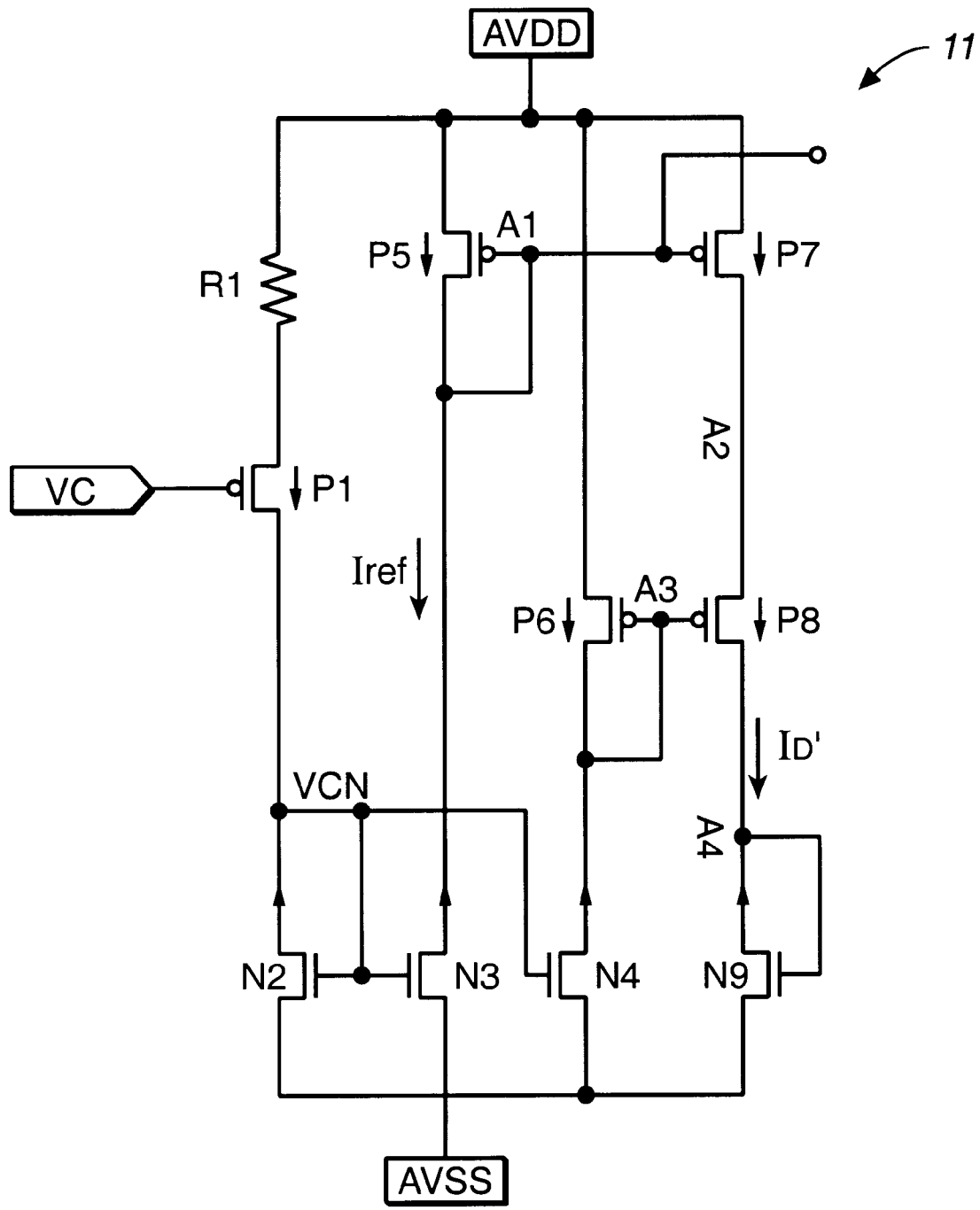
FIG._2

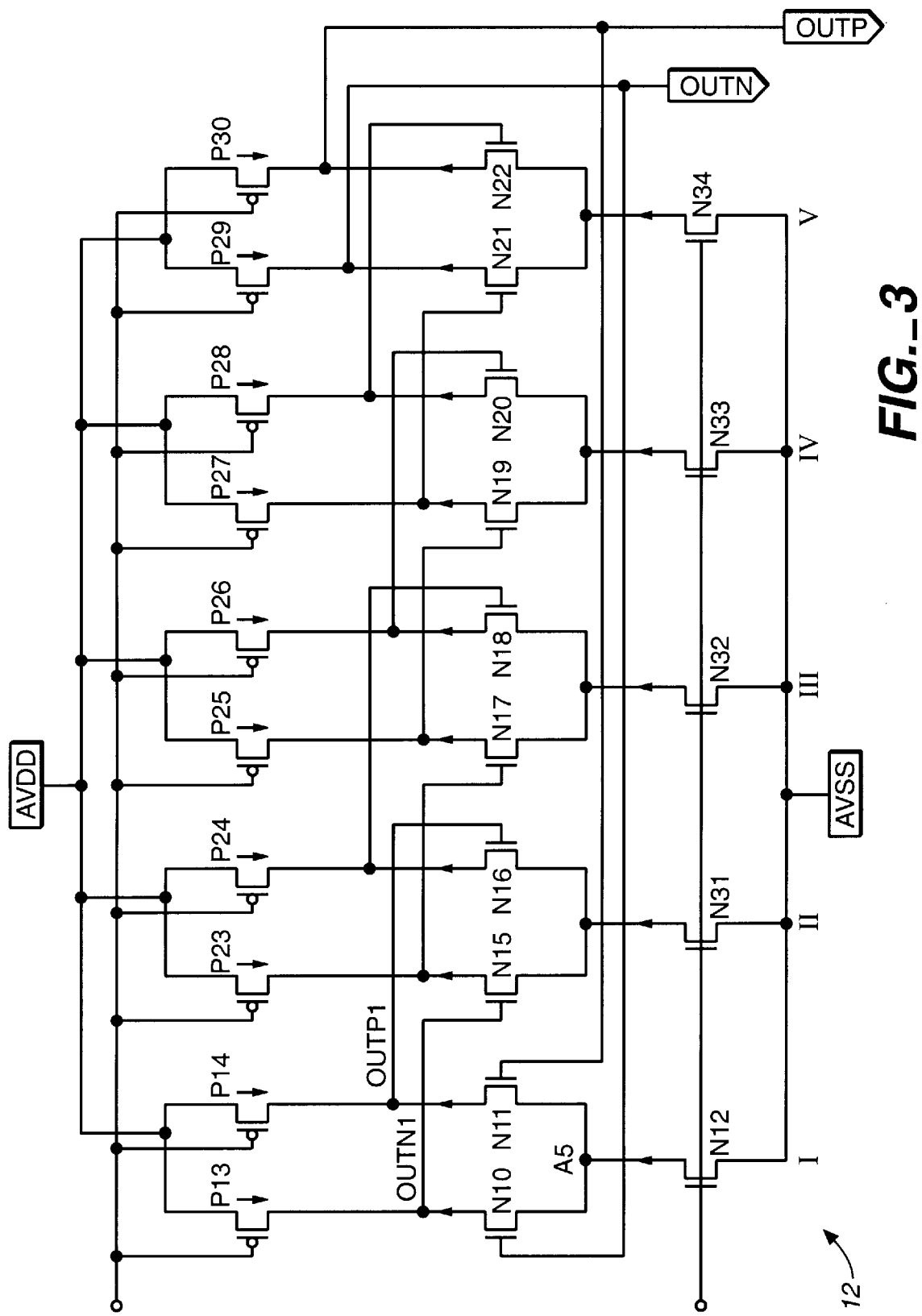
FIG._3

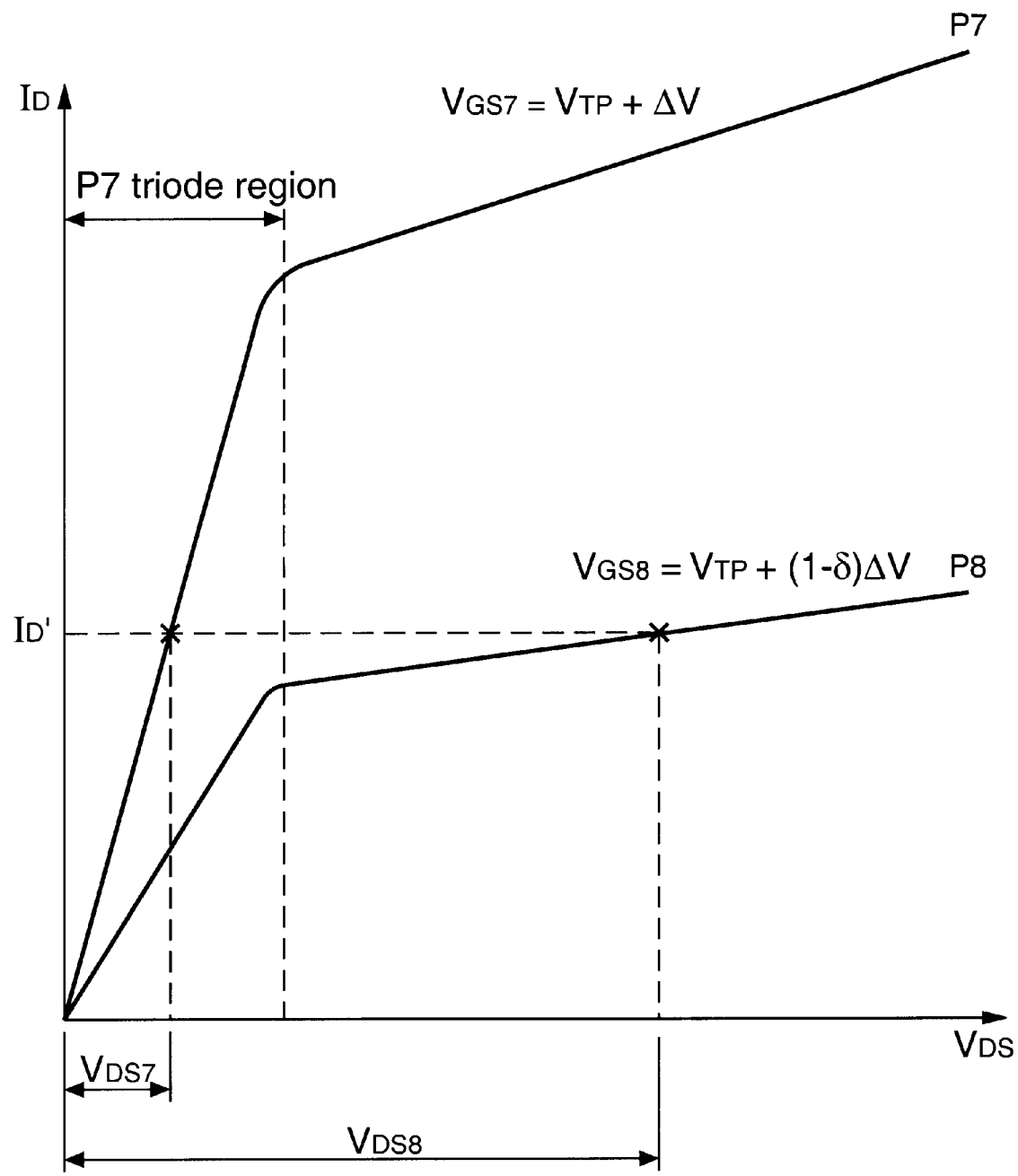
FIG._4

CMOS VOLTAGE CONTROLLED OSCILLATOR

BACKGROUND OF THE INVENTION

1. Field of the Invention

This invention pertains to a CMOS voltage controlled oscillator (VCO), and more particularly to a CMOS VCO having a voltage-to-current converter and an active MOS load operating in the triode region to provide improved performance characteristics.

2. Description of the Related Art

VCOs generate an output voltage whose frequency varies in step with an input voltage and are used in a variety of applications where maintaining sequential operations by a clocked pulse is required. Various types of VCOs have been proposed over the years. VCOs comprised of bipolar junction transistors have been used to generate output frequencies in 5 to 10 MHz range. Later, as the demand to use higher speed integrated circuits increased, CMOS based VCOs were designed and constructed to operate at considerably higher frequencies of up to around 300 MHz.

One type of higher speed CMOS VCO that has been proposed employs a plurality of inverters comprised of CMOS transistors connected in a ring configuration. Another similar type uses a plurality of delay circuits, each comprised of a differential pair of MOS transistors, connected in a ring configuration. The delay time in each of the delay circuits is controlled by adjusting the amount of current supplied to each of the delay circuits.

Although these CMOS VCOs were an improvement over their predecessors using bipolar junction technology, they presented certain problems as well. For example, variations in the power source voltage typically resulted in changes in the delay time which, in turn, resulted in variations in the frequency of operation, making the VCO unsuitable for low jitter applications.

An improvement along these lines was proposed in U.S. Pat. No. 5,673,008 which provides a CMOS VCO that is immune to variations in power voltage. This VCO employs a plurality of differential input/output delay cells arranged in a ring configuration. However, the structure of this CMOS VCO is such that it is not able to generate a small logic swing on the order of 0.5 V to enable it to generate very high frequencies. In particular, the load transistors in the delay cells are conventionally configured to operate in the saturation region which limits its performance characteristics.

OBJECTS OF THE INVENTION

Therefore, it is an object of this invention to overcome the aforementioned problems.

It is another object of this invention to provide a CMOS VCO having an active MOS load that operates exclusively in the triode region.

It is a further object of this invention to provide a CMOS VCO that has a small differential logic swing to produce a relatively high frequency output (>550 MHz) even with 0.7 μm technology.

It is yet another object of this invention to provide a CMOS VCO that is well suited for low power supply applications.

It is still a further object of this invention to provide a CMOS VCO that is well adapted for applications which require a very fast and stable clock.

SUMMARY OF THE INVENTION

In one aspect of the invention, a voltage controlled oscillator is provided which includes a voltage-to-current converter for generating reference currents. A MOS transistor receives an input voltage at its gate and transfers that voltage to a reference current. This MOS transistor has a sufficiently large size to maintain its gate-to-source voltage relatively constant under varying conditions. The voltage-to-current converter further comprises two pairs of current mirror MOS transistors which cooperate with each other to generate the reference currents.

In accordance with the invention two MOS transistors in the voltage-to-current converter are configured to cause a third MOS transistor in the voltage-to-current converter to operate in the triode region. Specifically, one of the two MOS transistors has an aspect ratio $(W_P/L_P)$ and the other has an aspect ratio $(W_P/L_P)/n$, wherein $1<n<4$.

The voltage controlled oscillator further includes a current controlled oscillator portion having a plurality of delay stages connected in a ring configuration. Each of the delay stages comprises a pair of input MOS transistors and a pair of load MOS transistors, one of the load MOS transistors being coupled to one of the input MOS transistors and the other load MOS transistor being coupled to the other input MOS transistor. In accordance with the invention, the voltage-to-current converter causes each of the load MOS transistors to operate in the triode region.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIG. 1 is a circuit diagram of a CMOS VCO in accordance with preferred embodiments of the invention.

FIG. 2 is a circuit diagram showing the voltage-to-current (V-to-I) converter of the CMOS VCO of FIG. 1.

FIG. 3 is a circuit diagram showing the delay cells which collectively comprise the current controlled oscillator (ICO) portion of the CMOS VCO of FIG. 1.

FIG. 4 is a graphical representation of the current-voltage characteristics of certain transistors in the V-to-I converter and illustrates the operating points of these transistors.

DESCRIPTION OF THE PREFERRED EMBODIMENTS

Referring to FIG. 1, a diagram of the CMOS VCO 10 is illustrated in accordance with preferred embodiments of the invention. The CMOS VCO 10 includes a voltage-to-current (V-to-I) converter and a current controlled oscillator (ICO) portion, identified generally by the reference numerals 11 and 12 respectively. The V-to-I converter 11 generates a stable and predictable dc reference current that is controlled by a variable input voltage VC to bias the transistors in the ICO portion 12. The ICO portion 12 of the overall circuit has five stages, each having two active load MOS transistors. These stages are identified by the Roman numerals I, II, III, IV and V. In accordance with CMOS technology, both the V-to-I converter 11 and ICO portion 12 are comprised of a plurality of MOS transistors of both the NMOS and PMOS type. In the description and drawings herein NMOS transistors are designated with the prefix N and PMOS transistors with the prefix P.

Referring now more specifically to the V-to-I converter 11, which is shown in both FIGS. 1 and 2, the variable input voltage VC is applied to the gate of transistor P1, the source of which is connected to one end of resistor R1 whose second end is connected to a first supply voltage AVDD which may be, for example, 3.3 V or 5.0 V. The drain of transistor P1 is coupled to the drain and gate of transistor N2 and also to the gates of transistors N3 and N4 to form a node having a voltage designated by VCN. Thus, transistor N2 is interconnected with transistors N3 and N4 to form a pair of current mirrors. Preferably, N3 and N4 are of the same size, meaning that they each have the same channel width and channel length.

The V-to-I converter 11 further includes transistors P5 and P6 which are of different sizes and which are configured so that the ratio of their aspect ratios is within a certain range so as to force transistor P7 to operate exclusively in the triode region. Specifically, if the aspect ratio of P5=$(W_P/L_P)$, then the aspect ratio of P6=$(W_P/L_P)/n$, where $1<n<4$. The drain and gate of P5 are coupled to each other and to the gate of transistor P7 in current mirror configuration to form a node having a voltage A1. The drain and gate of P6 are also coupled together and also to the gate of transistor P8 to form a node with voltage A3. The sources of transistors P5, P6 and P7 are coupled to AVDD while the source of transistor P8 is coupled to the drain of transistor P7 to form a node having voltage A2. The drains of transistors P5, P6 and P8 are connected to the drains of transistors N3, N4 and N9, respectively, and the sources of those latter three transistors as well as the source of transistor N2 are coupled to AVSS which may be grounded or may be a second supply voltage.

In operation, transistor P1 and resistor R1 transfer the VCO input voltage VC directly to a reference current Iref shown on FIG. 1. The size of P1 is quite large so its gate-to-source voltage does not vary much during operation of the CMOS VCO 10 due to temperature or power supply variations. Through the two current mirrors made up of transistors N2 and N3, and N2 and N4, Iref is "carried over" to transistors P5 and P6 to produce bias voltages A1, A3 and VCN. In the second stage of the V-to-I converter 11, P8 is biased indirectly by voltage A1 and operates in the saturation region when the aspect ratios of P5 and P6 are set within the range previously described which also forces P7 to operate exclusively in the triode region. With P7 operating in the triode region, its current $I_D'$ is always less than Iref. Moreover, operating in the triode region, P7 acts as a load which exhibits excellent linearity characteristics.

A detailed analysis of the V-to-I converter 11 will now be given with reference to FIGS. 1, 2 and 4. In this analysis, VTP (the threshold voltage) and $\Delta V$ (=$V_{GS}-V_{TP}$) are taken to be negative since P5–P8 are enhancement-type PMOS transistors. Thus, $V_{TP} \approx 0.7$ V. Also, n is equal to 2 in this biasing example; thus, the aspect ratio of P6 is one-half of the aspect ratio of P5. Beginning the analysis, the gate-to-source voltage of each of transistors P5 and P7 (i.e., $V_{GS5}$ and $V_{GS7}$)=AVDD−A1=$V_{TP}+\Delta V$ and A3=$V_{TP}+\sqrt{2}\Delta V$. Moreover, the current Iref may be defined in terms of the parameters of P5 as follows:

$$Iref=(\mu_p/2) \cdot C_{OX} \cdot (W_{P5}/L_{P5}) \cdot (V_{GS5}-V_{TP})^2,$$

where $\mu_p$ is a physical constant indicative of the mobility of holes in the induced p-channel, $C_{OX}$ is the oxide capacitance which is the capacitance per unit area of the gate-to-body capacitor for which the oxide layer serves as dielectric, $W_{P5}$ is the channel width of transistor P5, $L_{P5}$ is the channel length of P5, $V_{GS5}$ is the voltage of the gate with respect to the source of P5, and $V_{TP}$ is the threshold voltage. At the same time, Iref, which also runs through transistor P6, may be defined with respect to P6 as follows:

$$Iref=(\mu_p/2) \cdot C_{OX} \cdot (W_{P6}/L_{P6}) \cdot (V_{GS6}-V_{TP})^2,$$

where $W_{P6}$ is the channel width of transistor P6, $L_{P6}$ is the channel length of P6 and $V_{GS6}$ is the voltage of the gate with respect to the source of P6. With n=2, $(W_{P5}/L_{P5})=2 \cdot (W_{P6}/L_{P6})$. Making this substitution and combining the two equations defining Iref; yields:

$$2 \cdot (V_{GS5}-V_{TP})^2 = (V_{GS6}-V_{TP})^2.$$

Therefore, $|(V_{GS6}-V_{TP})|=\sqrt{2} \cdot |(V_{GS5}-V_{TP})|$.

P7 and P8 are preferably of the same size, and since they run the same current $I_D'$, $V_{GS7}-V_{TP} \approx V_{GS8}-V_{TP}$. This means that $|V_{DS7}|=|(\sqrt{2}-1+\delta) \cdot \Delta V|<|\Delta V|$, where $\delta$ is a small value ($0<\delta<<1$), because the current $I_D'$ in P8 is less than Iref The quantity $\delta \cdot \Delta V$ is the overdrive voltage drop needed to move the operating point of transistor P7 from the saturation region to the triode region and to make P7's triode region current equal to P8's saturation current. Thus, $|V_{GS7}|=|V_{TP}|+|\Delta V|$ and $V_{GS8}=|V_{TP}|+|(1-\delta) \cdot \Delta V|$. Therefore, transistor P7 is operating in the triode region. Moreover, in the typical case, $V_{GS9}$ is approximately 1 V and $|V_{G6}-V_{G9}|<|V_{TP}|$, so transistor P8 is operating in the saturation region.

From the analysis, it is apparent that P8 is operating in the saturation region which means that P7 must be operating in the triode region because $|V_{DS7}|<|V_{GS7}|-|V_{TP}|$. When operating as a load in the triode region, P7 acts like a resistor with good linearity characteristics. FIG. 4, which is a graphical representation of the current-voltage characteristics of transistors P7 and P8, illustrates the operating points of these transistors. As shown in FIG. 4, transistor P8 is in the saturation region whereas transistor P7 is in the triode region. Also, Turning now to ICO portion 12 of the CMOS VCO 10, which is shown in FIGS. 1 and 3, stages I–V are connected in a ring configuration wherein the outputs of each of stages I–IV are coupled to the inputs of the next stage and the outputs of stage V are coupled to the inputs of stage I. Each of the stages I–V is similarly configured in that each has two NMOS input transistors, two PMOS load transistors and an NMOS current source transistor.

The input transistors of stage I are identified as N10 and N11 respectively. In accordance with the ring configuration, the gates of N10 and N11 receive input voltage control signals OUTN and OUTP respectively. The sources of input transistors N10 and N11 are connected together and are also connected to the drain of current source transistor N12 whose source is coupled to AVSS and whose gate receives its voltage control signal from a node having a voltage A4 of V-to-I converter 11. The drains of transistors N10 and N11 are respectively coupled to the drains of PMOS load transistors P13 and P14 to form output voltage signals OUTN1 and OUTP1 which form the inputs to stage II. The sources of load transistors P13 and P14 are coupled to each other and to AVDD while the gates of these transistors are each biased by voltage A1 produced by V-to-I converter 11.

Each of the remaining stages (stages II–V) is similarly configured having a pair of input transistors identified as N15 and N16, N17 and N18, N19 and N20, and N21 and N22, respectively, a pair of PMOS load transistors P23 and P24, P25 and P26, P27 and P28, and P29 and P30, respectively, and a current source transistor N31, N32, N33 and N34, respectively. As shown in FIG. 1, the input and load transistors of each stage II–V are interconnected in a similar manner to that described with respect to stage I. In particular, it should be noted that, like the gates of PMOS load transistors P13 and P14 in stage I, each of the gates of PMOS load transistors P23–P30 in stages II–V are biased by voltage signal A1. With respect to the current source transistors N31–N34, it will be seen that their gates are coupled to each other as well as to the gate of current source transistor N12 to receive an input voltage signal A4 in V-to-I converter 11. The differential outputs of each stage II–V are taken from the pair of nodes formed by the interconnection between the drains of the corresponding input and load transistors, as shown in FIG. 1.

Preferably, transistors N9, N12, and N31–N34 are the same size; transistors N10, N11, and N15–N22 are the same size; and transistors P7, P8, P13, P14, and P23–P30 are the same size.

In accordance with the invention, PMOS load transistors P13, P14 and P23 to P30 are forced to operate exclusively in the triode region in the same way that transistor P7 is forced into the triode region: that is, by maintaining the ratio of the aspect ratios of transistors P5 and P6 within the prescribed range. Doing so forces P7 to operate in the triode region which, in turn, causes each of the load transistors P13, P14 and P23–P30 in the ICO portion 12 to operate in the triode region, since the gates of each of these transistors is connected and biased by voltage signal A1. With this design, the bias currents of current source transistors N12, N31, N32, N33 and N34 remain, at all times during operation, less than the saturation currents of transistors P5 and P6. Thus, the V-to-I converter 11 guarantees that the PMOS load transistors P13, P14 and P23–P30 will remain in the triode region to provide the VCO 10 with a good linear active load.

With its load transistors P13, P14 and P23 to P30 operating exclusively in the linear triode region, the CMOS VCO 10 of this invention has a small differential logic swing of approximately 0.5 V, making it capable of producing a relatively high frequency output of greater than 550 MHz using 0.7 μm technology (which conventionally only produces a frequency output of less than 350 MHz) and even higher speeds using 0.5 or 0.35 μm technology. At the same, noise from power supply caused by the VCO 10 is much less than that of a conventional design. While the CMOS VCO 10 of this invention is capable of being used in a variety of applications including driving conventional common mode logic (CML) circuits, the VCO 10 is particularly well suited for driving CML circuits which have a load structure similar to that of VCO 10 (i.e., circuits which employ active MOS loads operating exclusively in the triode region). These latter CML circuits can be driven at speeds of at least 500 MHz using 0.7 μm technology which is about twice as fast as conventional CMOS logic circuits using 0.7 μm technology. A CML circuit having such a load structure is the subject of a separate patent application entitled "High Speed Common Mode Logic Circuit," filed on even date herewith in the names of Kuang-Kai Chi and Ping Xu and assigned to the assignee of this application, the disclosure of which is incorporated by reference herein.

As will be apparent from the foregoing description, the small logic swing of CMOS VCO 10 makes it very useful for applications which require a very fast and stable clock as well as low power supply applications. VCO 10 is also very useful in applications in which space is at a premium, since the circuitry of VCO 10 occupies less area than that of a conventional VCO.

While the invention has been described in conjunction with specific embodiments, it will be evident to those skilled in the art in light of the foregoing description that many further alternatives, modifications and variations are possible. Thus, the invention described herein is intended to embrace all such alternatives, modifications, applications and variations as may fall within the spirit and scope of the appended claims.

What is claimed is:

1. A voltage controlled oscillator, comprising:

a voltage-to-current converter comprising a first pair of MOS transistors and a third MOS transistor, wherein said first pair of MOS transistors are configured to cause said third MOS transistor to operate in a triode region; and an ICO portion having at least one delay stage comprising a pair of input MOS transistors and a pair of load MOS transistors, one of said pair of load MOS transistors being coupled to one of said pair of input MOS transistors and the other of said pair of load MOS transistors being coupled to the other of said pair of input MOS transistors, wherein said voltage-to-current converter causes each of said load MOS transistors to operate in the triode region.

2. The voltage controlled oscillator of claim 1, wherein said first pair of MOS transistors are configured such that one of said first pair of MOS transistors has an aspect ratio $(W_P/L_P)$ and the other of said first pair of MOS transistors has an aspect ratio $(W_P/L_P)/n$, wherein $1<n<4$.

3. The voltage controlled oscillator of claim 1, wherein said voltage-to-current converter further comprises two pairs of current mirror MOS transistors which cooperate to generate currents in said voltage-to-current converter.

4. The voltage controlled oscillator of claim 1, wherein said ICO portion comprises a plurality of delay stages, each of said plurality of delay stages comprising a pair of input MOS transistors and a pair of load MOS transistors, one of said pair of load MOS transistors being coupled to one of said pair of input MOS transistors and the other of said pair of load MOS transistors being coupled to the other of said pair of input MOS transistors, wherein said voltage-to-current converter causes each of said load MOS transistors to operate in the triode region.

5. The voltage controlled oscillator of claim 4, wherein said plurality of delay stages are connected in a ring configuration.

6. The voltage controlled oscillator of claim 5, wherein said plurality of delay stages includes a first delay stage, at least one intermediate delay stage, and a last delay stage, each of said plurality of delay stages having inputs and outputs, wherein the outputs of said of said first delay stage are coupled to the inputs of said intermediate delay stage, the outputs of said at least one intermediate delay stage are coupled to the inputs of said last delay stage, and the outputs of said last delay stage are coupled to the inputs of said first delay stage.

7. The voltage controlled oscillator of claim 3, wherein said voltage-to-current converter further comprises a MOS transistor having a gate coupled to an input voltage source and having a sufficiently large aspect ratio to maintain its gate-to-source voltage relatively constant.

* * * * *